(12) United States Patent
Kim

(10) Patent No.: US 9,345,146 B2
(45) Date of Patent: May 17, 2016

(54) CIRCUIT BOARD FOR SECONDARY BATTERY AND SECONDARY BATTERY WITH THE CIRCUIT BOARD

(75) Inventor: Bongyoung Kim, Yongin-si (KR)

(73) Assignee: Samsung SDI Co., Ltd., Giheung-gu, Yongin-si, Gyeonggi-do (KR)

( * ) Notice: Subject to any disclaimer, the term of this patent is extended or adjusted under 35 U.S.C. 154(b) by 781 days.

(21) Appl. No.: 12/591,549

(22) Filed: Nov. 23, 2009

(65) Prior Publication Data

US 2010/0129687 A1    May 27, 2010

(30) Foreign Application Priority Data

Nov. 24, 2008    (KR) .................. 10-2008-0116788

(51) Int. Cl.

| | |
|---|---|
| *H01M 14/00* | (2006.01) |
| *H05K 1/00* | (2006.01) |
| *H05K 1/09* | (2006.01) |
| *H05K 3/24* | (2006.01) |
| *H01M 2/26* | (2006.01) |
| *H05K 3/32* | (2006.01) |
| *H05K 3/06* | (2006.01) |
| *H05K 3/28* | (2006.01) |
| *H01M 10/42* | (2006.01) |
| *H05K 3/00* | (2006.01) |

(52) U.S. Cl.
CPC ............... *H05K 3/244* (2013.01); *H01M 2/26* (2013.01); *H05K 3/328* (2013.01); *H01M 10/425* (2013.01); *H05K 1/00* (2013.01); *H05K 3/0023* (2013.01); *H05K 3/064* (2013.01); *H05K 3/28* (2013.01); *H05K 2201/10* (2013.01); *H05K 2201/10037* (2013.01); *H05K 2203/1115* (2013.01)

(58) Field of Classification Search
None
See application file for complete search history.

(56) References Cited

U.S. PATENT DOCUMENTS

| | | | | |
|---|---|---|---|---|
| 3,737,339 | A | * | 6/1973 | Alsberg et al. ................. 428/209 |
| 4,099,974 | A | * | 7/1978 | Morishita et al. ............. 106/1.23 |
| 5,234,558 | A | * | 8/1993 | Kadokura ..................... 204/485 |

(Continued)

FOREIGN PATENT DOCUMENTS

| | | |
|---|---|---|
| JP | 2002008626 | 1/2002 |
| KR | 1020070012937 A | 1/2007 |

(Continued)

OTHER PUBLICATIONS

Machine Translation of JP 2002-008626 A—Jan. 11, 2002.*

(Continued)

*Primary Examiner* — Ula C Ruddock
*Assistant Examiner* — Matthew Van Oudenaren
(74) *Attorney, Agent, or Firm* — Robert E. Bushnell, Esq.

(57) ABSTRACT

A secondary battery and to a circuit board for the secondary battery. The circuit board having a structure for enhancing the safety of a secondary battery, and a secondary battery with the same. The circuit board for a secondary battery includes an insulation layer, a terminal pad layer formed on the insulation layer, and a plating layer formed on the terminal pad layer. The thickness of the plating layer is greater than 20 micrometers. The plating layer is made of nickel. The secondary battery further includes a circuit protection device, and a bare cell electrically connected to the circuit protection device, wherein circuit protection device including a first lead plate electrically connected to the plating layer of the circuit board, the plating layer of the circuit board being made of the same material as that of the first lead plate of the circuit protection device.

9 Claims, 4 Drawing Sheets

(56) References Cited

U.S. PATENT DOCUMENTS

| | | | |
|---|---|---|---|
| 5,806,171 A * | 9/1998 | Wang | 29/612 |
| 2002/0150815 A1 | 10/2002 | Ehara | |
| 2003/0014863 A1* | 1/2003 | Lee et al. | 29/847 |
| 2003/0026053 A1* | 2/2003 | Toth et al. | 361/106 |
| 2004/0241904 A1* | 12/2004 | Lee et al. | 438/106 |
| 2005/0089753 A1 | 4/2005 | Yoon | |
| 2006/0269831 A1 | 11/2006 | Kim | |
| 2007/0020509 A1* | 1/2007 | Kim | 429/62 |
| 2007/0111557 A1* | 5/2007 | Higashiguchi et al. | 439/66 |
| 2008/0008910 A1* | 1/2008 | Koh | 429/7 |
| 2008/0118820 A1 | 5/2008 | Jang et al. | |
| 2009/0122455 A1* | 5/2009 | Jang et al. | 361/106 |

FOREIGN PATENT DOCUMENTS

| | | |
|---|---|---|
| KR | 1020080070352 A | 7/2008 |
| KR | 1020080084238 A | 9/2008 |
| KR | 1020090047686 A | 5/2009 |

OTHER PUBLICATIONS

Machine Translation of KR 10-2008-0084238 A—Sep. 19, 2008.*
Machine Translation of KR 10-2008-0070352 A—Jul. 30, 2008.*
"Fundamentals of Small Parts Resistance Welding" (http://www.miyachiamerica.com/servlet/servlet.FileDownload?retURL=%2Fapex%2FEducationalResources_Fundamentals&file=01530000000Jybm).

* cited by examiner

CIRCUIT BOARD FOR SECONDARY BATTERY AND SECONDARY BATTERY WITH THE CIRCUIT BOARD

CLAIM OF PRIORITY

This application makes reference to, incorporates the same herein, and claims all benefits accruing under 35 U.S.C. §119 from an application entitled CIRCUIT BOARD FOR SECONDARY BATTERY AND SECONDARY BATTERY WITH THE SAME earlier filed in the Korean Industrial Property Office on 24 Nov. 2008, and there duly assigned Serial No. 10-2008-0116788 by that Office.

BACKGROUND OF THE INVENTION

1. Field of the Invention

The present invention relates to a secondary battery, and more particularly, to a circuit board for a secondary battery and a secondary battery with the circuit board.

2. Description of the Related Art

Recently, portable electronic devices are being increasingly distributed due to rapid development of industries related to electronics, communications, and computers. Rechargeable secondary batteries are being mainly used as power sources of portable electronic devices.

Currently, pack type secondary batteries are being widely used. A pack type battery is one unit in which a bare cell and a circuit protection device are integrated. A safety device, called a circuit protection device, is generally used in a secondary battery. The electric resistance of the circuit protection device increases rapidly as its temperature increases. The circuit protection device is generally installed on a current path between a protective circuit module and a bare cell to interrupt current when it detects a high temperature state, for example, due to overcharge of the bare cell.

In order to enhance the safety of a secondary battery, it is necessary to install a circuit protection device more effectively.

BRIEF SUMMARY OF THE INVENTION

The present invention has been made in view of the above problems, and the present invention provides a circuit board having a structure for enhancing the safety of a secondary battery, and a secondary battery with the same. The present invention also provides a circuit board having a structure for economically manufacturing a secondary battery, and a secondary battery with the same.

In accordance with an aspect of the present invention, there is provided a circuit board for a secondary battery, comprising: an insulation layer; a terminal pad layer formed on the insulation layer; and a plating layer formed on the terminal pad layer.

The thickness of the plating layer is preferably greater than 20 micrometers.

The plating layer is made of nickel.

The terminal pad layer may be formed of a copper foil, and the terminal pad layer may be a portion of a wire pattern.

The circuit board may further comprise a photo solder resist (PSR) layer printed so as to cover the terminal pad layer except for at least a portion of the terminal pad layer, and the plating layer may be formed after the photo solder resist (PSR) layer is formed.

In accordance with another aspect of the present invention, there is provided a secondary battery having a circuit board an insulation layer; a terminal pad layer formed on the insulation layer; and a plating layer formed on the terminal pad layer, the secondary battery comprising: a circuit protection device; and a bare cell electrically connected to the circuit protection device, the circuit protection device including a first lead plate electrically connected to the plating layer of the circuit board, the plating layer of the circuit board being made of the same material as that of the first lead plate of the circuit protection device.

The first lead plate of the circuit protection device and the plating layer of the circuit board may be coupled to each other by resistance welding.

The plating layer of the circuit board may be made of nickel.

The thickness of the plating layer is preferably greater than 20 micrometers.

All the objects of the present invention can be achieved by the above-mentioned structures. More particularly, a protective circuit board for a secondary battery according to the present invention can prevent generation of spatters due to solder during the process of resistance-welding a lead plate of a circuit protection device to a terminal pad layer of a protective circuit board. Hence, the protective circuit board can prevent damage to the secondary battery, such as a short circuit in a wire pattern or a device, due to a spatter, thereby enhancing the safety of the secondary battery. Furthermore, according to the present invention, a separate soldering process can be omitted, thereby simplifying the production process of the secondary battery and enabling economical manufacturing of the secondary battery.

BRIEF DESCRIPTION OF THE DRAWINGS

A more complete appreciation of the present invention, and many of the attendant advantages thereof, will become readily apparent as the same becomes better understood by reference to the following detailed description when considered in conjunction with the accompanying drawings in which like reference symbols indicate the same or similar components, wherein.

DETAILED DESCRIPTION OF THE INVENTION

Hereinafter, an embodiment of the present invention will be described in detail with reference to the accompanying drawings.

Figure 1:
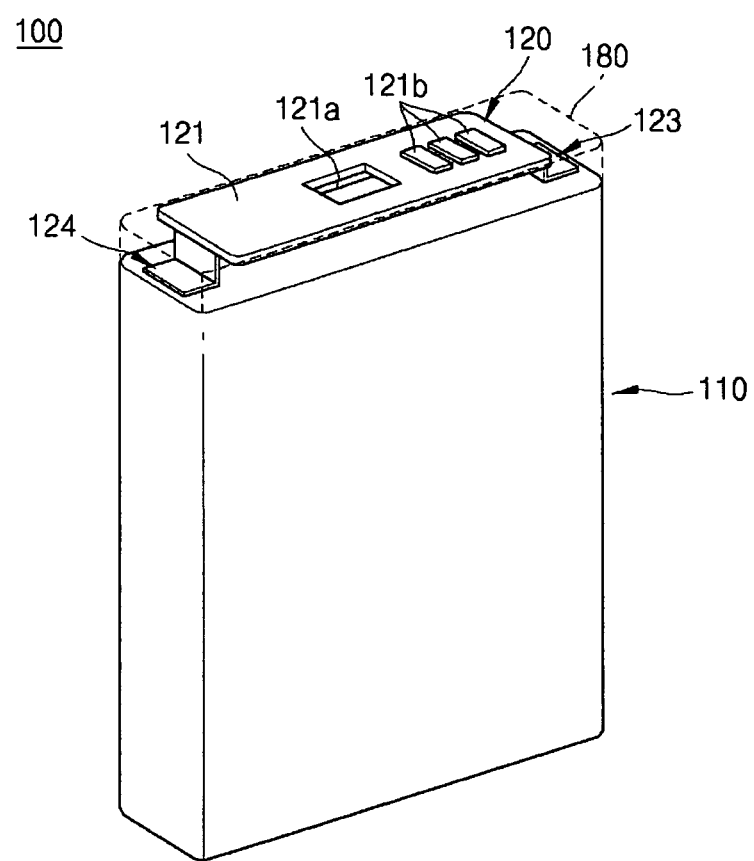
FIG. 1 is a perspective view illustrating a secondary battery including a circuit board according to an embodiment of the present invention.
Figure 2:
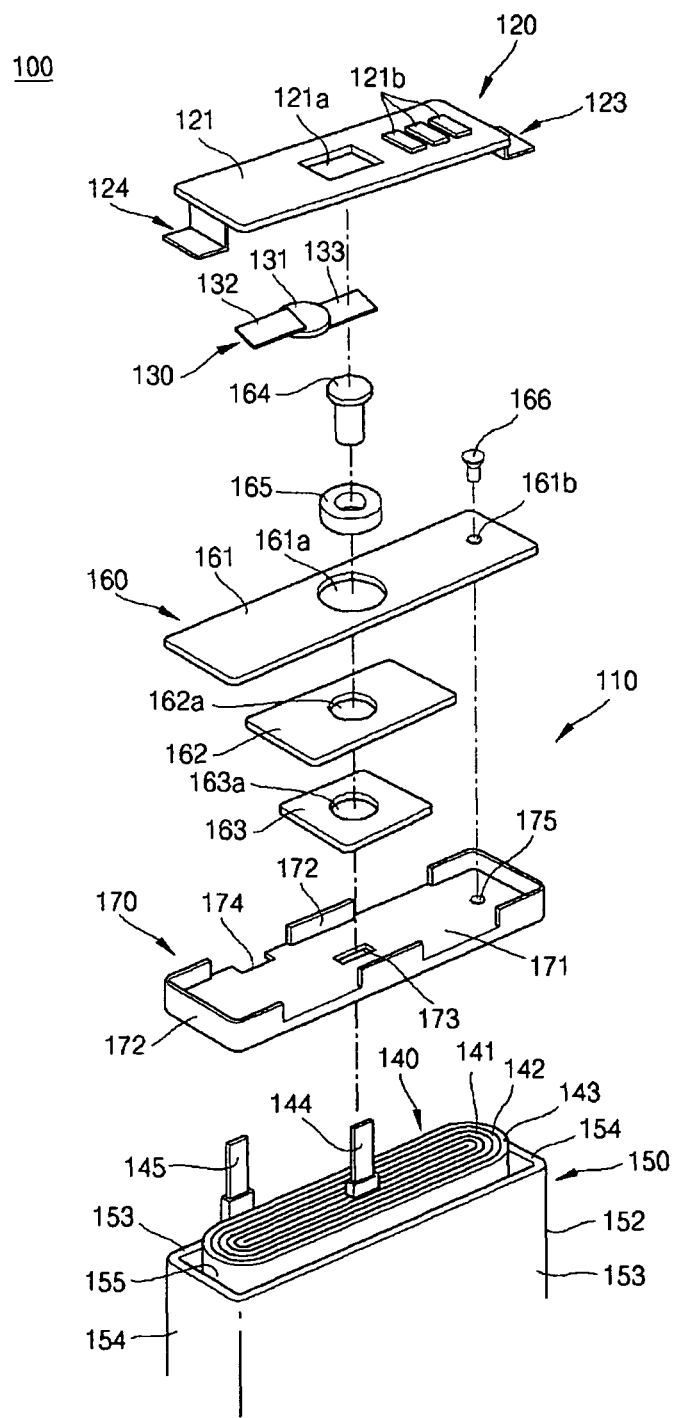
FIG. 2 is an exploded perspective view illustrating the secondary battery in FIG. 1.
Figure 3:
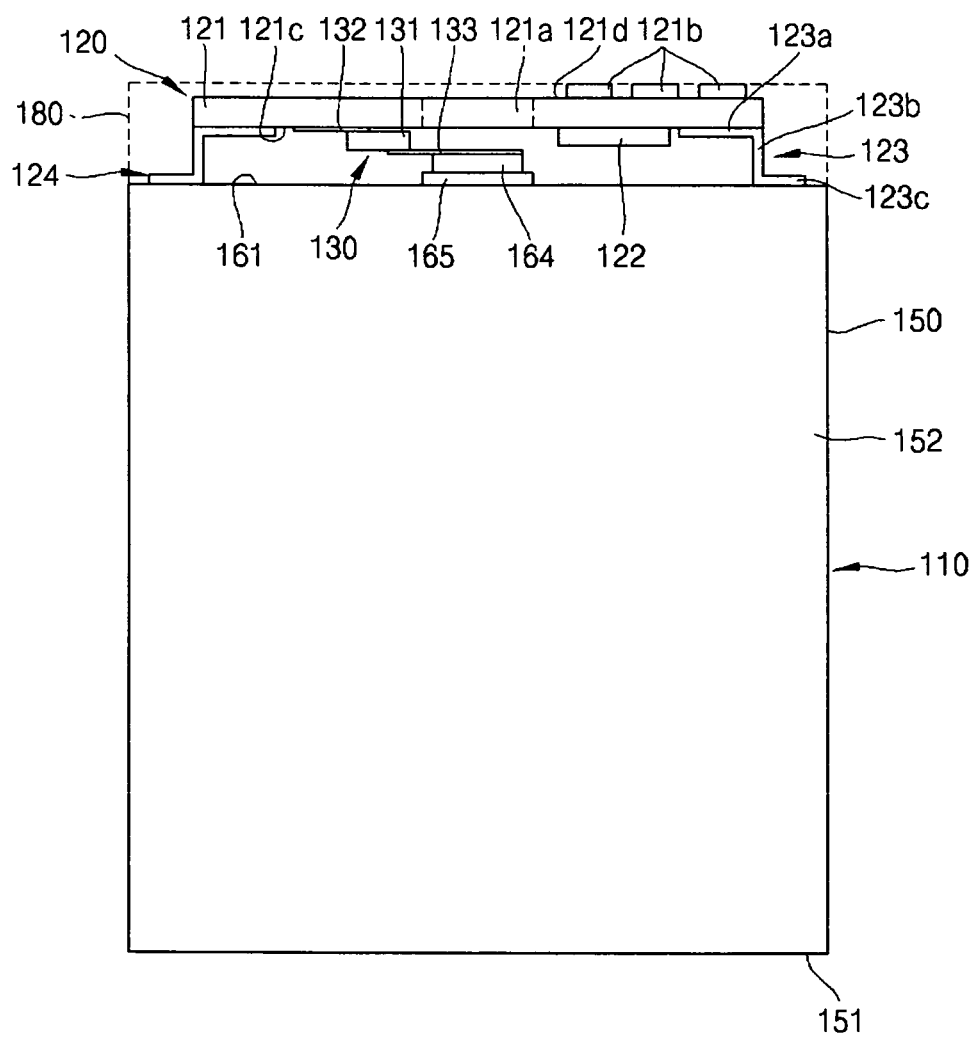
FIG. 3 is a front view illustrating the secondary battery in FIG. 1.

Referring to FIGS. 1 to 3, a secondary battery 100 according to an embodiment of the present invention includes a bare cell 110, a protective circuit module (PCM) 120, and a circuit protection device 130.

The bare cell 110 includes an electrode assembly 140, a can 150, a cap assembly 160, and an insulation case 170. The bare cell supplies electrical energy to an external load.

Referring to FIG. 2, the electrode assembly 140 includes a first electrode plate 141, a second electrode plate 142, and a separator 143 interposed between the two electrode plates 141 and 142. In the electrode assembly 140, the first electrode plate 141, the separator 143, and the second electrode plate 142 are stacked and wound in a jelly-roll type configuration. A first conductive electrode tab 144 is coupled to the first electrode plate 141 and protrudes over the upper end of the electrode assembly 140. A second conductive electrode tab 145 is coupled to the second electrode plate 142 and protrudes over the upper end of the electrode assembly 140.

It is assumed that the first electrode plate 141 is the negative electrode plate and the second electrode plate 142 is the positive electrode plate. Accordingly, the first electrode tab 144 is the negative electrode tab and the second electrode tab 145 is the positive electrode tab. However, the present invention is not limited thereto. In other words, the first electrode plate 141 may be the positive electrode plate and the second electrode plate 142 may be the negative electrode plate. In this case, the first electrode tab 144 may be the positive electrode tab and the second electrode tab 145 may be the negative electrode tab. The two electrode tabs 144 and 145 are made of a nickel metal but the present invention is not limited thereto. The electrode assembly 140 is accommodated in the interior space of the can 150.

Referring to FIGS. 1 to 3, the can 150 includes a bottom plate 151 and a side wall 152 extending upward from the periphery of the bottom plate 151. The bottom plate 151 has a substantially rectangular shape prolonged long in one direction. The side wall 152 includes two wide side walls 153 extending from the long edges of the bottom plate 151 and two narrow side walls 154 extending from the short edges of the bottom plate 151. An opening 155 is formed at the upper end of the can 150. The electrode assembly 140 and the insulation case 170 are accommodated in the interior space of the can 150. The can 150 may be made of a metal, and is made of aluminum or an aluminum alloy that is light and ductile. However, the material of the can 150 is not limited thereto. The can 120 is preferably produced by deep drawing.

Referring to FIG. 3, the cap assembly 160 includes a cap plate 161, an insulation plate 162, a terminal plate 163, and an electrode terminal 164. The cap assembly 160 covers the opening 155 of the can 150 such that the terminal plate 163 is located in the interior space of the can 150. The cap assembly 160 and the can 150 are coupled to each other, for example, by welding.

The cap plate 161 is a metal plate having the size and shape corresponding to the opening 155 of the can 150. The cap plate 161 is a substantially rectangular plate prolonged in one direction. The positive electrode tab 145 of the electrode assembly 140 is coupled and electrically connected to the cap plate 161, for example, by welding. A terminal through-hole 161a of a predetermined size is formed at a central portion of the cap plate 161, and an electrolyte injection hole 161b is formed on one side of the cap plate 161. The electrode terminal 164 is inserted into the terminal through-hole 161a. The electrode terminal 164 is inserted into a tube-shaped insulation gasket 165 for its electrical insulation from the cap plate 161 when it passes through the terminal through-hole 161a. The electrolyte is injected through the electrolyte injection hole 161b and a plug 166 is inserted into the electrolyte injection hole 161b to close it.

The insulation plate 162 is a substantially rectangular shape, and its opposite surfaces make contact with the cap plate 161 and the terminal plate 163 respectively. The insulation plate 162 electrically insulates the cap plate 161 and the terminal plate 163 from each other. A passage hole 162a is formed in the insulation plate 162. The electrode terminal 164 passes through the passage hole 162a.

The terminal plate 163 has a substantially rectangular shape, and one surface thereof makes contact with the insulation plate 162. The terminal plate 163 is electrically insulated from the cap plate 161 by the insulation plate 162. A through-hole 163a is formed in the terminal plate 163. The electrode terminal 164 passes through the through-hole 163a. One end of the electrode terminal 164 that has passed through the through-hole 163a is expanded sideward, and the electrode terminal 164 is coupled to the cap plate 161, the insulation plate 162, and the terminal plate 163. The electrode terminal 164 is electrically connected to the terminal plate 163. The negative electrode tab 144 of the electrode assembly 140 is coupled and electrically connected to the terminal plate 163, for example, by welding.

The electrode terminal 164 passes through the terminal through-hole 161a of the cap plate 161, the passage hole 162a of the insulation plate 162, and the through-hole 163a of the terminal plate 163. The electrode terminal 164 is insulated from the cap plate 161 by the insulation gasket 165 and the insulation plate 162, and is electrically connected to the terminal plate 163. A second lead plate 133 of the circuit protection device 130 that will be described later is electrically connected to the upper end of the electrode terminal 164.

The insulation case 170 is located over the electrode assembly 140 in the interior space of the can 150 to electrically insulate the electrode assembly 140 and the cap assembly 160 from each other.

The insulation case 170 includes a body 171 and support walls 172 extending upward from the periphery of the body 171. The body 171 is a plate having substantially the same shape as the opening 155 of the can 150. The body 171 has a first electrode tab withdrawal hole 173 through which the negative electrode tab 144 of the electrode assembly 140 is withdrawn, a second electrode tab withdrawal recess 174 through which the positive electrode tab 145 of the electrode assembly 140 is withdrawn, and an electrolyte injection hole 175 providing a passage through which the electrolyte is introduced into the electrode assembly 140.

Referring to FIGS. 1 to 4, the protective circuit module 120 includes a circuit board 121, a first support member 123, and a second support member 124. The protective circuit module 120 controls the overall operation of the secondary battery 100 including charge and discharge of the secondary battery 100. The circuit board 121 is a printed circuit board (PCB) in which a wire pattern is printed. The circuit board 121 has a substantially rectangular shape prolonged long in one direction. The circuit board 121 includes a first surface 121c and a second surface 121d opposite to the first surface 121c. A plating layer 125 to which a first lead plate 132 of the circuit protection device 130 is electrically connected is formed on the first surface 121c of the circuit board 121.

Figure 5:
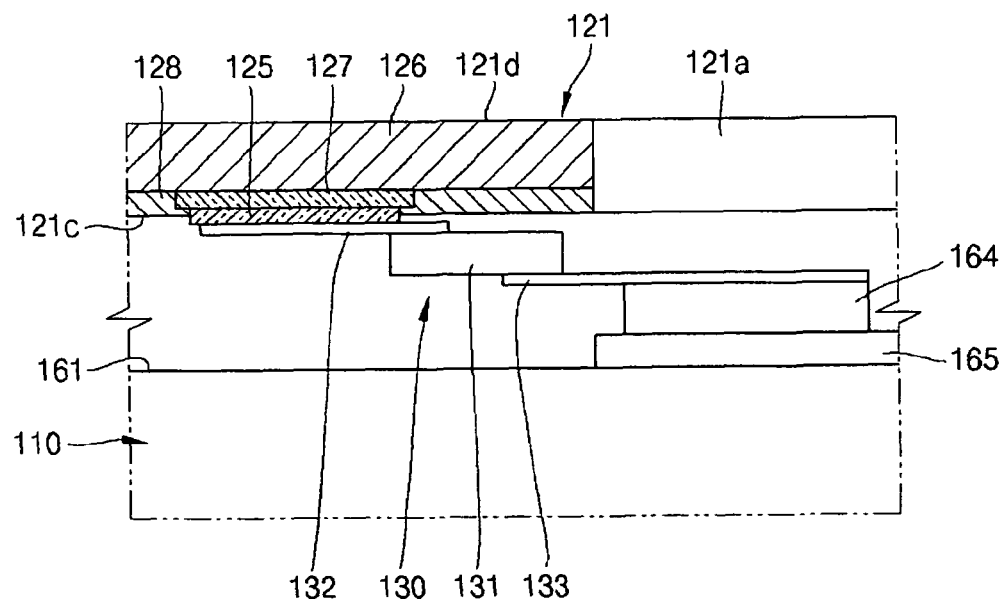
FIG. 5 is a sectional view illustrating the protective circuit module to which the circuit protection device is attached in FIG. 3.

Referring to FIG. 5, the circuit board 121 includes an insulation layer 126, a terminal pad layer 127, a photo solder resist (PSR) layer 128, and a plating layer 125. The insulation layer 126 is generally made of paper and a phenol resin, but the present invention is not limited thereto. The terminal pad layer 127 is made of a conductive material such as a copper foil, and constitutes a portion of the wire pattern of the circuit board 121. Although not illustrated in detail, the terminal pad layer 127 is physically connected to the wire pattern formed in the circuit board 121. If the wire pattern is narrow, a terminal pad layer 127 may be additionally formed, and otherwise, a portion of the wire pattern may form the terminal pad layer 127. The photo solder resist (PSR) layer 128 is printed on the insulation layer 126 so as to expose the terminal pad layer 127. The plating layer 125 covers the terminal pad layer 127. The plating layer 125 is made of the same material as that of the first lead plate 132 of the circuit protection device 130 for resistance welding. The plating layer 125 is made of nickel. The plating layer 125 preferably has a thickness of more than 20 micrometers so that it can be resistance-welded to the first lead plate 132 of the circuit protection device 130. If the thickness of the plating layer 125 is smaller than 20 micrometers, it is difficult to normally perform resistance welding.

The manufacturing process of the circuit board 121 having the structure as illustrated in FIG. 5 is as follows. First, a copper foil is formed on the insulation layer 126. Next, a desired photo resist wire pattern is formed on the copper foil. Thereafter, after the copper foil is etched along the photo resist pattern, the photo resist left on the copper foil is removed to form a wire pattern. Then, the terminal pad layer 127 is formed together. Thereafter, a photo solder resist is printed on portions other than, for example, the desired terminal pad layer 127 to form a photo solder resist (PSR) layer 128. Then, the terminal pad layer 127 is not covered with the photo solder resist (PSR) layer 128 but is exposed. In this state, the plating layer 125 is formed on the exposed terminal pad layer 127.

Figure 4:
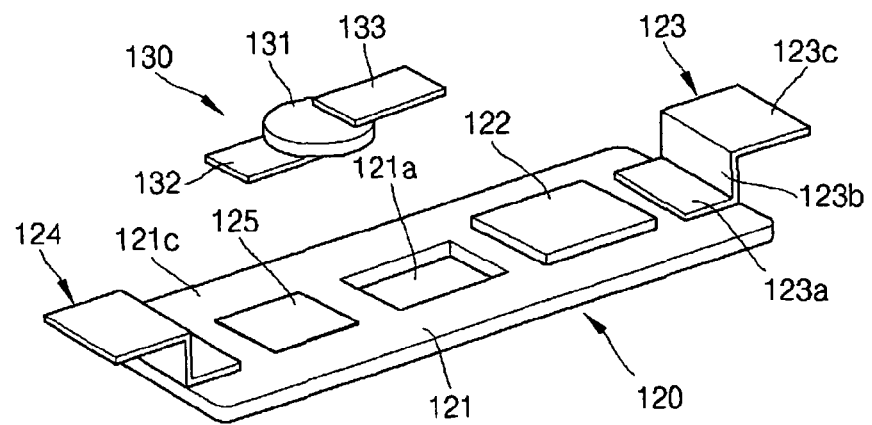
FIG. 4 is a bottom perspective view illustrating a protective circuit module and a circuit protection device in FIG. 2.

Referring to FIGS. 3 and 4, an electric circuit device 122 is mounted onto the first surface 121c of the circuit board 121. The electric circuit device 122 includes negative devices such as a control IC, a charge/discharge switch, a resistance, and a capacitor. A first support member 123 and a second member 124 are coupled to the lengthwise opposite ends of the first surface 121c. The first surface 121c faces the upper surface of the cap plate 161 of the bare cell 110 with them being spaced apart from each other.

External terminals 121b, electrically connected to an external load or a charger, are located on the second surface 121d of the circuit board 121. A through-hole 121a is formed at a central portion of the circuit board 121. The second lead plate 133 of the circuit protection device 130 and the electrode terminal 164 of the bare cell 110 are welded to each other through the through-hole 121a to be electrically connected to each other thereby.

The first support member 123 and the second support member 124 are located at opposite ends of the first surface 121c of the circuit board 121. The first support member 123 is a plate-like member, and includes a first connection portion 123a, a support portion 123b, and a second connection portion 123c. The first connection portion 123a is coupled to the first surface 121c of the circuit board 121, making contact with it. The support portion 123b is substantially perpendicular to the first connection portion 123a and extends from the first connection portion 123a. The second connection portion 123c is substantially perpendicular to the support portion 123b and is coupled to the cap plate 161 of the bare cell 110, making contact with it. The first connection portion 123a and the second connection portion 123c extend in opposite directions from the support portion 123b. The bare cell 110 and the circuit board 121 are space apart from each other by the existence of the support portion 123b after they are coupled to each other. The second support member 124 has the same structure as that of the first support member 123, so a detailed description thereof will be omitted. At least one of the two support members 123 and 124 is made of a conductive material such as nickel to electrically connect the circuit board 121 to the cap plate 161, i.e. the positive electrode of the bare cell 110.

The circuit protection device 130 includes a circuit protection body 131, a first lead plate 132, and a second lead plate 133. The first lead plate 132 is electrically connected to one surface of the circuit protection body 131, and the second lead plate 133 is electrically connected to the opposite surface thereof. The circuit protection body 131 is located on the cap plate 161 of the bare cell 110 to directly detect heat generated in the bare cell 110. Hence, the safety against overcharge of the secondary battery is enhanced. The first lead plate 132 is made of a conductive material such as nickel. The first lead plate 132 is coupled to the plating layer 125 provided in the circuit board 121 of the protective circuit module 120 by resistance welding and is electrically connected to it. The second lead plate 133 is made of a conductive material such as nickel. The second lead plate 133 is coupled to the electrode terminal 164 of the bare cell 110, for example, by resistance welding and is electrically connected to it.

Now, the process of manufacturing the secondary battery according to the embodiment of the present invention will be described in detail with reference to FIGS. 1 to 5.

First, the bare cell 110 is assembled using the electrode assembly 140, the can 150, and the cap assembly 160. The electrode assembly 140 is received inside the can 150. Then, the negative electrode tab 144 and the positive electrode tab 145 of the electrode assembly 140 protrude through the opening 155 of the can 150. Next, the insulation case 170 is inserted into the can 150 through the opening 155 of the can 150.

Accordingly, the negative electrode tab 144 of the electrode assembly 140 protrudes outside through the first electrode tab withdrawal hole 173 of the insulation case 170, and the positive electrode tab 145 of the electrode assembly 140 protrudes through the second electrode tab withdrawal hole 174 of the insulation case 170. Thereafter, the negative electrode tab 144 of the electrode assembly 140 is electrically connected to the terminal plate 163 of the cap assembly 160. Next, the insulation plate 162 is positioned over the terminal plate 163, with holes 162a and 163a aligned.

Thereafter, positive electrode tab 145 of the electrode assembly 140 is electrically connected to the cap plate 161 of the cap assembly 160 as the cap plate 161 is coupled to the opening 155 of the can 150, for example, by welding, such that hole 161a is aligned with hole 162a. Gasket 165 is then fitted in hole 161a, and electrode terminal 164 is inserted through the gasket 165 and holes 162a and 163a to electrically contact negative electrode tab 144.

Next, the bare cell 110, the protective circuit module 120, and the circuit protection device 130 are coupled to each other. First, the first lead plate 132 of the circuit protection device 130 is resistance-welded to the plating layer 125 formed in the circuit board 121 of the protective circuit module 120 to couple the circuit protection device 130 to the circuit board 121. Since the first lead plate 132 of the circuit protection device 130 is resistance-welded to the plating layer 125, the safety of the secondary battery can be enhanced.

Conventionally, a nickel plate is coupled to a terminal pad layer by soldering for resistance welding, occasionally generating spatters by solder in the process of resistance welding a nickel plate and a lead plate of a circuit protection device, causing a circuit board to be damaged. However, in the embodiment of the present invention, a lead plate of a circuit protection device is resistance-welded to a plating layer, thereby eliminating the possibility of generation of spatters due to solder. Moreover, a soldering process for coupling the nickel plate to the terminal pad layer may be omitted, thereby simplifying the production process of the secondary battery and economically manufacturing the secondary battery.

Thereafter, the first support member 123 and the second support member 124 of the protective circuit module 120 are resistance-welded to the cap plate 161 of the bare cell 110 to couple the protective circuit module 120 to the bare cell 110.

The second lead plate 133 of the circuit protection device 130 is resistance-welded to the electrode terminal 164 of the bare cell 110 through the through-hole 121a formed in the circuit board 121 of the protective circuit module 120 to electrically connect the second lead plate 133 to the electrode terminal 164 of the bare cell 110.

Thereafter, a resin molding section 180 combined with the bare cell 110 is formed at the periphery of the protective circuit module 120 to finally finish the secondary battery 100.

Although the embodiments of the present invention have been described in detail hereinabove, it should be understood that many variations and modifications of the basic inventive concept herein described will still fall within the spirit and scope of the present invention as defined in the appended claims.

What is claimed is:

1. A circuit board for a secondary battery, comprising:
   an insulation layer having a first surface and a second surface opposite to the first surface, the first surface being adjacent to and spaced apart from the secondary battery;
   a terminal pad layer formed on the first surface of the insulation layer;
   an external terminal formed on the second surface of the insulation layer; and
   a plating layer formed on the terminal pad layer, the plating layer being made of nickel,
   the terminal pad layer being formed of a copper foil and being a portion of a wire pattern, and
   a photo solder resist (PSR) layer printed to cover the terminal pad layer except a portion of the terminal pad layer spaced apart from edges of the terminal pad layer and the portion having a surface opposite to the first surface of the insulation layer, and the plating layer is formed on the portion of the terminal pad layer not covered by the PSR layer,
   the plating layer contacting a first lead plate of a circuit protection device including a second lead plate disconnected from the insulation layer and the second lead plate facing outside of the secondary battery through a through-hole.

2. The circuit board of claim 1, the thickness of the plating layer being greater than 20 micrometers.

3. The circuit board of claim 1, the plating layer being formed on the terminal pad layer after the photo solder resist (PSR) layer is formed.

4. A secondary battery comprising a circuit board including:
   an insulation layer;
   a terminal pad layer formed on the insulation layer; and
   a plating layer formed on the terminal pad layer;
   a circuit protection device; and
   a bare cell electrically connected to the circuit protection device,
   the circuit protection device including a first lead plate and a second lead plate,
      the first lead plate contacting and electrically connected to the plating layer of the circuit board, the plating layer of the circuit board being made of the same material as that of the first lead plate of the circuit protection device, and
      the second lead plate disconnected from the insulation layer and the second lead plate facing outside of the secondary battery through a through-hole,
   the plating layer being made of nickel,
   the terminal pad layer being formed of a copper foil and being a portion of a wire pattern,
   the circuit board further including a photo solder resist (PSR) layer printed to cover the insulation layer and the terminal pad layer except a portion of the terminal pad layer spaced apart from edges of the terminal pad layer and the portion having a surface opposite to the first surface of the insulation layer, and the plating layer is formed on the portion of the terminal pad layer not covered by the PSR layer.

5. The secondary battery of claim 4, the first lead plate of the circuit protection device and the plating layer of the circuit board being coupled to each other by resistance welding.

6. The secondary battery of claim 4, further comprising the through-hole formed at a portion of the circuit board corresponding to an electrode terminal of the bare cell.

7. The secondary battery of claim 6, the second lead plate of the circuit protection device and the electrode terminal of the bare cell being welded to each other through the through-hole.

8. A circuit board for a secondary battery, the circuit board having a top side and a bottom side, the bottom side being adjacent to the secondary battery, the circuit board comprising:
   an insulation layer formed on the bottom side of the circuit board;
   a terminal pad layer formed on the insulation layer;
   a photo solder resist (PSR) layer printed to cover the insulation layer and the terminal pad layer except a portion of the terminal pad layer spaced apart from edges of the terminal pad layer and the portion having a surface opposite to a surface of the insulation layer, and the plating layer is formed on the portion of the terminal pad layer not covered by the PSR layer; and
   a plating layer formed on the portion of the terminal pad layer not covered by the photo solder resist (PSR) layer, the plating layer being the closest layer to the secondary battery,
   the plating layer being made of nickel,
   the terminal pad layer being formed of a copper foil and being a portion of a wire pattern,
   the plating layer contacting a first lead plate of a circuit protection device including a second lead plate disconnected from the insulation layer and the second lead plate facing outside of the secondary battery through a through-hole.

9. The circuit board of claim 8, the thickness of the plating layer being greater than 20 micrometers.

* * * * *